United States Patent [19]

Fukunaka et al.

[11] Patent Number: 4,779,232

[45] Date of Patent: Oct. 18, 1988

[54] PARTIAL WRITE CONTROL APPARATUS

[75] Inventors: Hidetada Fukunaka, Hadano; Koichi Ikeda, Machida, both of Japan

[73] Assignee: Hitachi, Ltd., Tokyo, Japan

[21] Appl. No.: 52,546

[22] Filed: May 20, 1987

[30] Foreign Application Priority Data

May 28, 1986 [JP] Japan .................................. 61-121133

[51] Int. Cl.[4] ........................ G11C 7/00; G11C 11/40
[52] U.S. Cl. ................................................... 365/189
[58] Field of Search ........................ 365/189, 230, 239

[56] References Cited

U.S. PATENT DOCUMENTS

| 4,618,946 | 10/1986 | Little et al. | 365/189 |
| 4,639,894 | 1/1987 | Ishii | 365/189 |
| 4,663,735 | 5/1987 | Novak et al. | 365/189 X |
| 4,685,089 | 4/1987 | Patel et al. | 365/189 X |

Primary Examiner—Stuart N. Hecker
Assistant Examiner—Alyssa H. Bowler
Attorney, Agent, or Firm—Kenyon & Kenyon

[57] ABSTRACT

In a partial write control apparatus for a memory having a high speed operation mode such as a nibble mode or a page mode, when a partial write request for a plurality of words including those which require partial write is received, a memory control signal generator causes the memory to read successively all the words requiring partial write in a single high speed operation mode read cycle. A merging circuit merges those portions of the read-out words which need no alteration with write data and forms a group of updated complete words. Then, the memory control signal generator causes the memory to write successively these words in a single high speed operation mode write cycle.

4 Claims, 3 Drawing Sheets

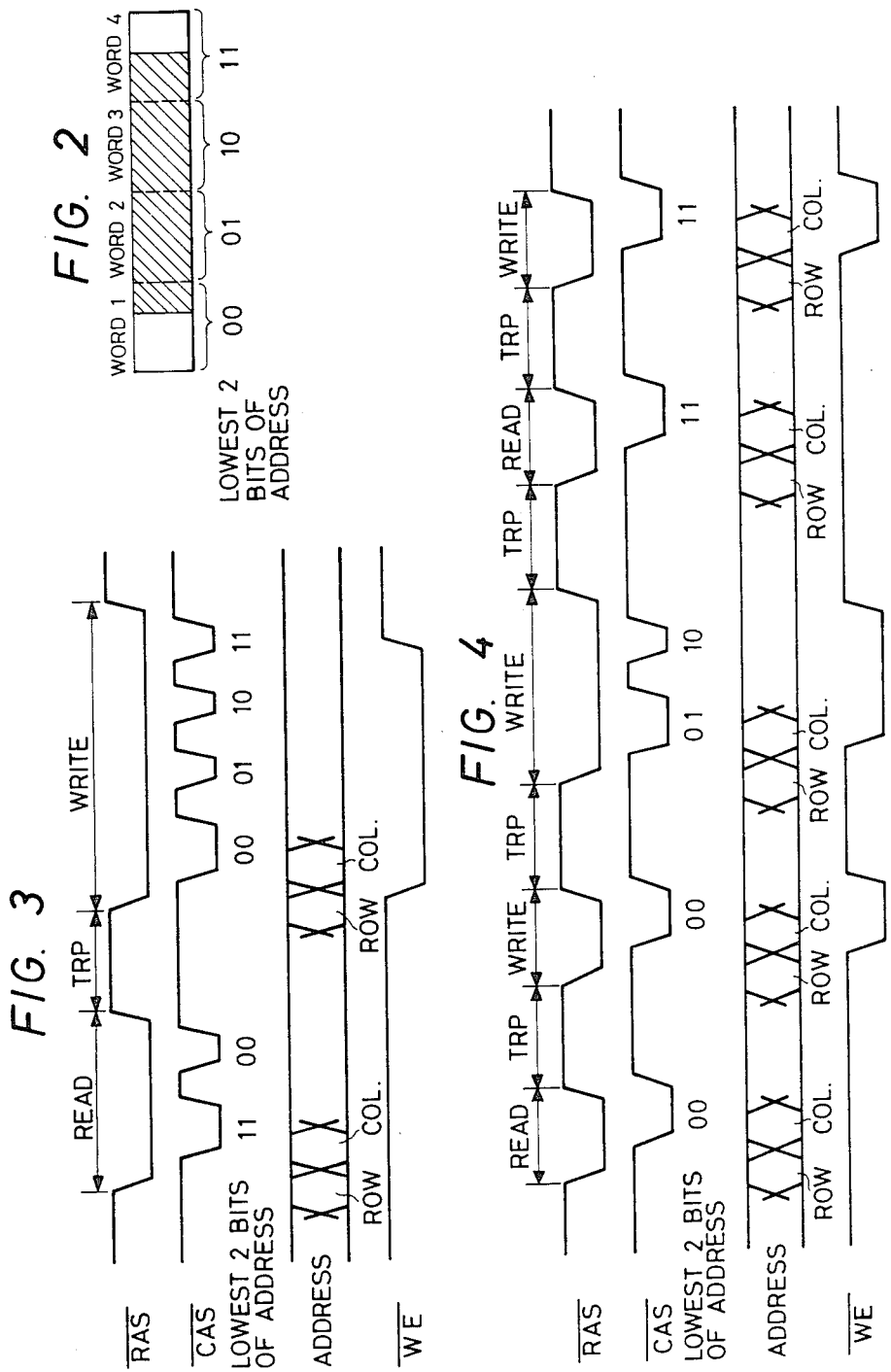

| TYPE | PARTIAL WRITE WORD DESIGNATION | READ/WRITE OPERATION | | ADDRESS INCREMENT | RAS | CAS | WE |
|---|---|---|---|---|---|---|---|
| 1 | W 0 1 2 3 | R | W1,W2 | 4B × 0 | 1 | 2 | |
| | | W | W1,W2 | 4B × 0 | 1 | 2 | 1 |
| 2 | | R | W1,W2,W3 | 4B × 0 | 1 | 3 | |
| | | W | W1,W2,W3 | 4B × 0 | 1 | 3 | 1 |
| 3 | | R | W4,W1 | 4B × 3 | 1 | 2 | |
| | | W | W1,W2,W3,W4 | 4B × 0 | 1 | 4 | 1 |
| ⋮ | | | | | | | |

PARTIAL WRITE CONTROL APPARATUS

BACKGROUND OF THE INVENTION

This invention relates generally to partial write to a memory, and more particularly to a partial write control apparatus for a memory equipped with a high speed operation mode which permits access to a plurality of addressed locations in a single access cycle.

A rewrite or update processing of only part of an access unit of stored information (which will be hereinafter represented by a word) is referred to as "partial write". The partial write processing consists of a read operation of an object word, an operation which replaces part of the word thus read by new data to form a partially updated word and a write operation which writes the partially updated word. Therefore, it needs a longer time than an ordinary write operation.

Japanese Patent Laid-Open No. 145428/1978 discloses a method which shortens the time necessary for partial write. This method utilizes a shift register group which is disposed inside a memory controller in order to hold the accepted access request information (such as control information, data and an address) and has a length corresponding to a memory cycle time, so that when the read operation of the object word of partial write is completed, the corresponding access request information is returned to the input stage of the shift register group together with the word that has been read and updated, thereby automatically registering a write request. This shortens the period of time in which the access requester unit is involved in the operation of the memory.

In the field of dynamic RAMs (Random Access Memories), on the other hand, a memory device equipped with a high speed operation mode which permits access to a plurality of word locations in a single access cycle caused by one RAS signal is well known. In a mode called a "page mode", for example, access en bloc to a plurality of addresses having a common row address is possible by providing sequentially different column addresses under a certain row address. In a mode called a "nibble mode", on the other hand, access en bloc to up to four continuous addresses is possible as the address value is counted up inside the memory after one set of the row address and the column address is given. However, an efficient partial write mechanism for a memory constituted by these types of elements has not yet been developed sufficiently. The method disclosed in the prior art reference described above is for a memory device of such a type wherein each access operation is carried out for a single word.

A series of words resident at continuous addresses must often be processed in practical data processing. Needless to say, the high speed operation modes described above are generally helpful to improve the speed of processing of this type, but a special mechanism is necessary in order to write efficiently a series of words containing words for which partial write is necessary. In conventional read/write mechanisms, the word for which partial write is necessary must be separated from the other words and processed singly by a separate read/write operation, implying that the advantage of the high speed operation modes described above is not fully utilized.

SUMMARY OF THE INVENTION

The present invention contemplates to accomplish the processing en bloc of writing a plurality of words containing words requiring partial write in a high speed operation mode and to make the most of the advantage of the high speed operation mode for partial write.

In a partial write control apparatus in accordance with the present invention, memory control signal generating means responds to a write request involving partial write to supply the memory first with operation control signals for causing a single read cycle for successively reading out of all the locations requiring partial write, and subsequently with operation control signals for causing a single write cycle for successively writing into all the locations that are designated for writing. Merging means merges the data to be written with those portions of the data read out in the read cycle which do not need any change in order to form a group of updated complete words, and these words are then written into the memory in the write cycle. Address generating means supplies the memory with read address information for the read cycle and subsequently with write address information for the write cycle.

In the memory combined with the partial write control apparatus of the present invention, all those words which must be partially updated by partial write are read out en bloc in a single read cycle in the high speed operation mode, and all those words to be written which have been formed by merging, including the partially updated words, are written en bloc in a single write cycle in the high speed operation mode.

BRIEF DESCRIPTION OF THE DRAWINGS

FIG. 2 shows an example of the object data of a partial write operation;

FIG. 3 shows a time chart which exemplifies the operation of the apparatus shown in FIG. 1;

FIG. 4 shows a time chart which exemplifies the partial write operation performed by a conventional mechanism;

DESCRIPTION OF THE PREFERRED EMBODIMENTS

Figure 1:
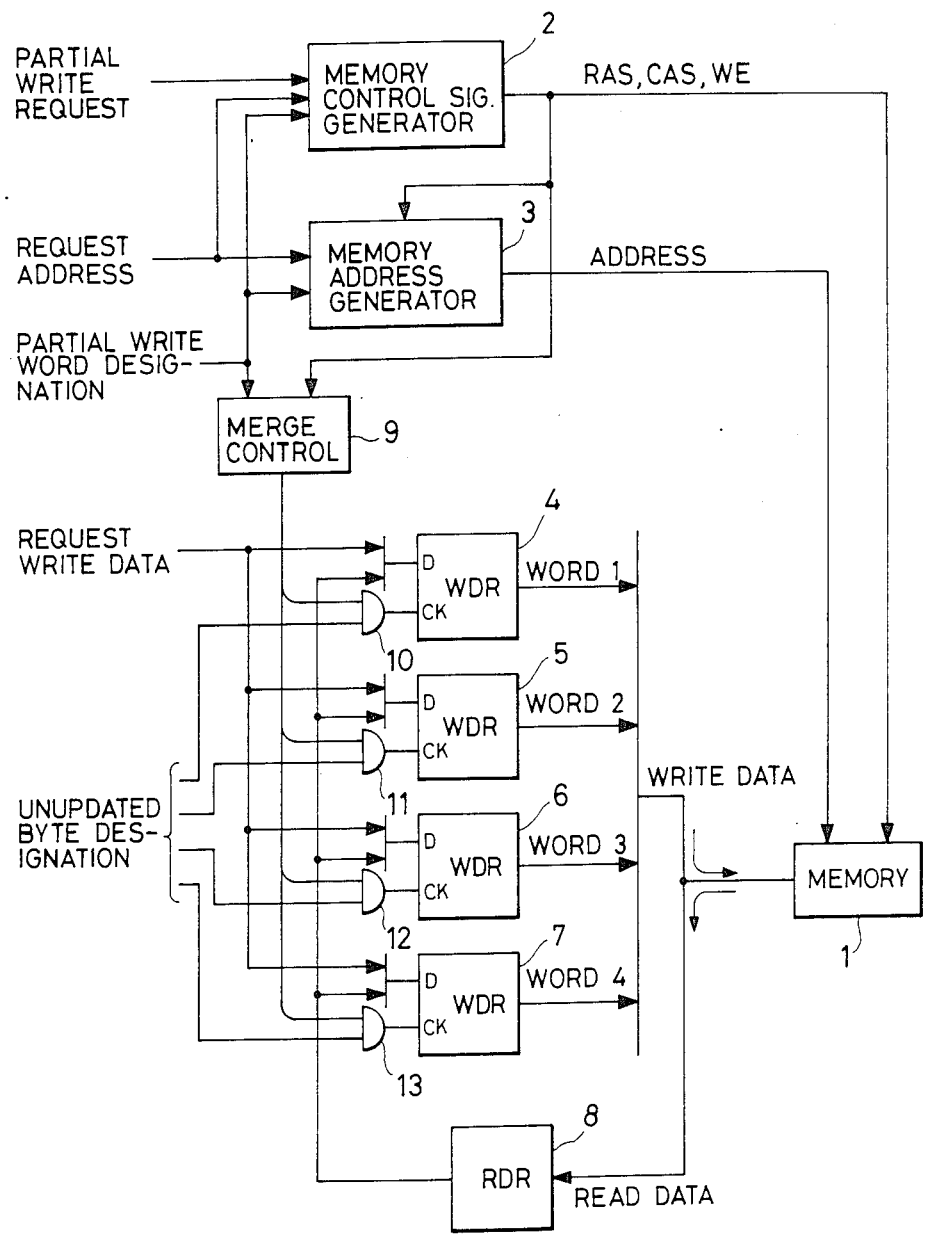
FIG. 1 is a block diagram showing one embodiment of the present invention.

FIG. 1 shows one embodiment of the present invention for a memory using the nibble mode element as the memory element. In the memory 1 using the nibble mode element, access to up to four continuous addresses whose lowest two bits are in the range of from 00 to 11 can be made in a single address cycle by counting up the address value that is initially given. It will now be assumed that four words at the continuous addresses shown in FIG. 2 must be updated. In FIG. 2, hatching represents the portions which must be updated. In other words, the first and fourth words need partial write. An access requester unit (such as a processor) generates a write request involving partial write (hereinafter called "partial write request"), a request address Specifying the starting address and the word number, partial write word designation information designating the words requiring partial write (the first and fourth words in FIG. 2), data to be written (request write data) and unupdated byte designation information designating those bytes which do not need any change in the partial write object words (portions without hatching in FIG. 2).

A memory control signal generator 2 is fundamentally the same as an ordinary memory control signal generator for a nibble mode dynamic RAM, and generates one RAS signal and sequential CAS signals in the number equal to the requested word number. It further generates a write enable signal (WE) when write is requested. For the purpose of adapting to the present invention, however, a circuit for generating such signals as described above for reading the words requiring partial write in the nibble mode in accordance with the partial write request and the partial write word designation information before generating ordinary write control signals is added. A memory address generator 3, too, is fundamentally the same as an ordinary memory address generator for the nibble mode dynamic RAM, divides a request address into a row address and a column address and sends them in synchronism with the RAS signal and the first CAS signal, respectively. For the purpose of adapting to the present invention, however, a circuit for generating the starting address of the word whcich requires partial write in accordance with the partial write word designation information and in synchronism with the read operation control signals described above is added.

The request write data are held in write data registers (WDR) 4 to 7 for the first to fourth words. The words that are sequentially read and need partial write are sent to the inputs of WDR 4 to 7 through a read data register (RDR) 8. A merge controller 9 decodes the partial write word designation signal and sequentially opens gates 10 to 13 connected to the clock terminal (CK) of WDR corresponding to the word that is sequentially read to RDR 8, in synchronism with the memory control signal. The unupdated byte information signals designating the positions of the bytes which do not require any change (that is, the bytes read out of the memory and to be written back unchanged) are also applied to the gates connected to WDRs holding the words which need partial write. Therefore, those bytes which do not need any change in the words sequentially read out in RDR 8 enter the corresponding positions of WDRs 4 to 7 and are merged with the request write data, thereby forming a complete word group to be written into the memory 1.

When partial write is requested for the data represented by hatching in FIG. 2 and the access requester unit issues the afore-mentioned associated necessary information, the write data are held in WDRs 4 to 7 and the memory control signal generator 2 and the memory address generator 3 cause first a nibble mode read cycle for reading the fourth and first words for which partial write is necessary, as shown in FIG. 3. In this case, since the lowest two bits of the address continue from the fourth words (11) to the first word (00), the address of the fourth word is given first and updated within the memory 1 to the address of the first word in a single step, as shown in the drawing. In this read cycle, the fourth word and the first word read out sequentially to RDR 8 are written to the corresponding byte positions of WDRs 7 and 4 under the control of the merge controller 9 and the unupdated byte designation information and form a complete word group (the first to fourth words shown in FIG. 2) to be written into the memory 1.

Next, after an RAS precharge time (TRP), the memory control signal generator 2 and the memory address generator 3 cause a write cycle for writing the first to fourth words in the ordinary nibble mode. In this write cycle the contents of WDRs 4 to 7 are sequentially written into the continuous addresses of the memory 1, and the writing of a series of words involving partial write is completed.

If the values of the lowest two bits of the addresses of words requiring partial write are not continuous such as when the first and third words need partial write, for example, the first to third words are read out in the read cycle and only those portions of the first and third words which do not need any change are entered in WDRs 4 and 6, respectively, in accordance with the unupdated byte designation information, while the second word read out is casted away.

Figures 5, 6:
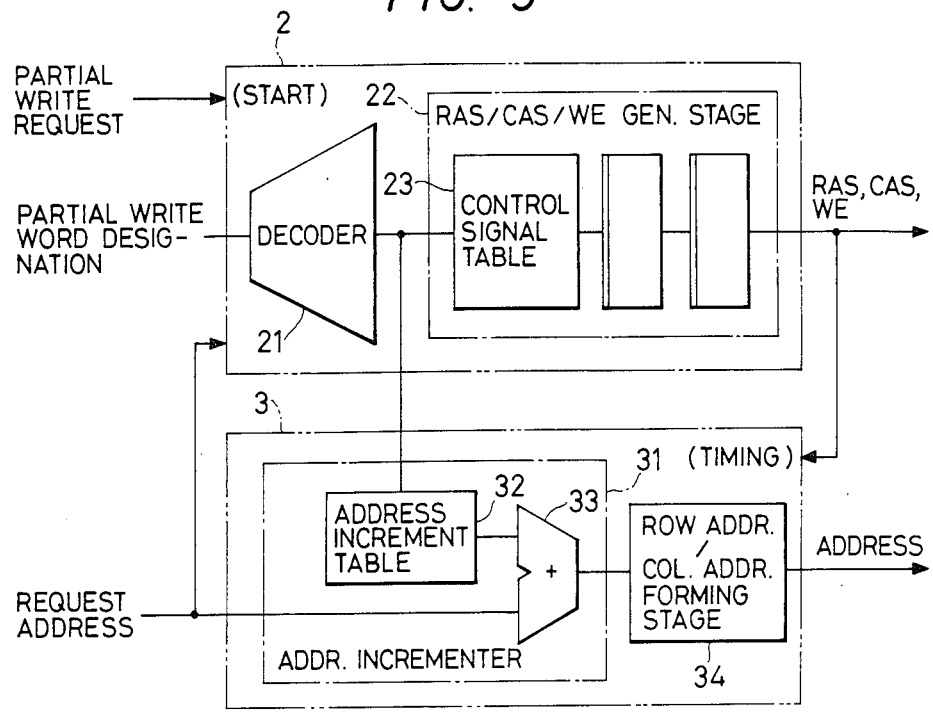
FIG. 5 is a block diagram showing in detail a memory control signal generation circuit and a memory address generation circuit in FIG. 1.
FIG. 6 is a diagram showing a control signal table and an address increment table in FIG. 5.

FIG. 5 is a block diagram showing in further detail the memory control signal generator 2 and the memory address generator 3. A decoder 21 in the memory control signal generator 2 decodes the partial write word designation information, determines the type of partial write and supplies information representing the partial write type to a control signal table 23 in an RAS/CAS/WE generation stage 22 and to an address increment table 32 in an address incrementor 31 of the memory address generator 3.

FIG. 6 shows an example of the contents of the control signal table 23 and address increment table 32. In the diagram, the columns "RAS", "CAS" and "WE" represent the contents of the control signal table 23 while the column "address increment" represents the content of the address increment table 32. The columns "partial write word designation" and "read/write operation" are not part of these tables 23 and 32 but are added in order to facilitate the understanding of these tables. The value in the column "address increment" represents an increment value to be added to the request address in order to obtain the strating memory address, where smybol B stands for "byte" and one word consists of four bytes. Numerals in the columns "RAS", "CAS" and "WE" represent the number of corresponding signals that are to be generated.

Turning back again to FIG. 5, the control signal table 23 receives the partial write type information from the decoder 21, designates the RAS, CAS and WE signals for the read and write cycles, respectively, and lets the RAS/CAS/WE generation stage 22 generate sequentially these designated signals. On the other hand, the address increment table 32 sequentially generates the address increment values for the read and write cycles, respectively, in response to the partial write type information from the decoder 21 while an adder 33 adds these address increment values to the request address to form the starting addresses for the read and write cycles, respectively. A row address/column address forming stage 34 divides each starting memory address into a row address and a column address and sends them in synchronism with the RAS signal and the first CAS signal. The address incrementor 31 may also include a decoder 21 of its own.

In the case of FIGS. 2 and 3, the partial write word designation information designates the first and fourth words. Therefore, the decoder 21 designates the partial write type 3. The processing of this type consists of a read sequence for the fourth and first words and a subsequent write sequence for the first to fourth words. Since the starting memory address for the read operation is the address of the fourth word, it is a value obtained by adding three word-length (4B×3) to the request address, and since the strating memory address for the write operation is the address of the first word, it is the request address itself and the increment value is 0 (4B×0). The CAS signal is generated twice in the read cycle and four times in the write cycle.

If partial write shown in FIGS. 2 and 3 is to be accomplished by individually processing the partial write object words while separating them from the other words, the process may consist of the sequence of reading the first word and writing it after partial updating, writing the second and third words in the nibble mode and reading the fourth word and writing it after partial updating as shown in FIG. 4. In contrast, the number of times of the RAS precharge is reduced from 4 to 1 in this embodiment, and the read and the write operations that must otherwise be performed separately for every partial write object word are put together in a read and a write cycle, respectively, of the nibble mode so that the operation speed is improved drastically in total.

When the page mode element is used, the column address of each word is provided by the memory address generator in each of the read and write cycles. Such a memory controller itself is well known in the art. Therefore, in the memory of this type also, a series of write operations including partial write can be carried out in a single read cycle and a single write cycle subsequent thereto by means of essentially the same mechanism as described above. In this mode the access object addresses need not be continuous.

The present invention described above can fully utilizes the advantages of the high speed operation modes for partial write, thereby reducing the number of times of the RAS precharge and shortening the average access time per word. Since the RAS precharge time is about 100 ns, the time necessary for the operation shown in FIG. 3 can be shortened by 300 ns by the reduction of the number of times of the RAS precharge alone as compared with FIG. 4. In addition, considering the read operation, for example, the access time from the RAS signal is about 150 ns when the individual word is separately processed and the access time from the CAS signal for each of the second and succeeding words is about 75 ns while the access time in the nibble mode is about 25 ns. Therefore, since all the access operations are carried out in a single read cycle and a single write cycle in the high speed operation mode, the necessary time is reduced further. As a result, the operation speed is drastically improved in total.

What is claimed is:

1. A partial write control apparatus for a memory which has a number of locations each for storing an access unit of data and identified by an address and is provided with a high speed operation mode permitting successive accesses to a plurality of locations in a single access cycle, comprising:

means for receiving request information requesting writing specified data into a plurality of specified locations one of which at least requires partial write;

means responsive to said request information for supplying said memory with control signals for causing a single read cycle in said high speed operation mode to take place for successively reading out of all of the locations requiring partial write, and subsequently with control signals for causing a single write cycle in said high speed operation mode to take place for successively writing into all of said specified locations;

means responsive to said request information for supplying said memory with address information for said read cycle and subsequently with address information for said write cycle; and merging means connected to receive said specified data and data read out of the memory in said read cycle and responsive to said request information for merging said specified data with portions not to be altered of the data read out in said read cycle to form a group of complete access units of data to be written into the memory in said write cycle.

2. A partial write control apparatus as claimed in claim 1, wherein said merging means includes a plurality of registers each for holding an access unit of data, means for storing said specified data into the corresponding portions of said registers and means for storing the portions not to be altered of the data read out in said read cycle into the corresponding portions of said registers.

3. A partial write control apparatus as claimed in claim 1, wherein said memory comprises a plurality of dynamic RAM elements, and said high speed operation mode is a nibble mode.

4. A partial write control apparatus as claimed in claim 1, wherein said memory comprises a plurality of dynamic RAM elements, and said high speed operation mode is a page mode.

* * * * *